US011397837B2

(12) United States Patent
Biswas et al.

(10) Patent No.: US 11,397,837 B2
(45) Date of Patent: Jul. 26, 2022

(54) SYSTEMS AND METHODS FOR PEST FORECASTING USING HISTORICAL PESTICIDE USAGE INFORMATION

(71) Applicant: Tata Consultancy Services Limited, Mumbai (IN)

(72) Inventors: Sandika Biswas, Thane (IN); Jayantrao Mohite, Thane (IN); Srinivasu Pappula, Hyderabad (IN)

(73) Assignee: TATA CONSULTANCY SERVICES LIMITED, Mumbai (IN)

( * ) Notice: Subject to any disclaimer, the term of this patent is extended or adjusted under 35 U.S.C. 154(b) by 1115 days.

(21) Appl. No.: 15/648,209

(22) Filed: Jul. 12, 2017

(65) Prior Publication Data

US 2018/0018414 A1   Jan. 18, 2018

(30) Foreign Application Priority Data

Jul. 12, 2016  (IN) .............................. 201621023796

(51) Int. Cl.
*G06F 17/18*  (2006.01)
*G06N 20/00*  (2019.01)
(Continued)

(52) U.S. Cl.
CPC ............. *G06F 30/20* (2020.01); *A01N 25/00* (2013.01); *G06F 17/11* (2013.01); *G06F 17/18* (2013.01);
(Continued)

(58) Field of Classification Search
CPC .................................. G06N 20/00; G06F 17/18
See application file for complete search history.

(56) References Cited

U.S. PATENT DOCUMENTS 9,563,852 B1 *  2/2017  Wiles ................... A01B 79/005
2002/0016676 A1 *  2/2002  Sann ....................... G06Q 30/06
702/3

(Continued)

FOREIGN PATENT DOCUMENTS

CN          103155836         6/2013

OTHER PUBLICATIONS

Kiran, Unhealthy Region of Citrus Leaf Detection Using Image Processing Techniques (Year: 2014).*
(Continued)

*Primary Examiner* — Abdullah Al Kawsar
*Assistant Examiner* — Tewodros E Mengistu
(74) *Attorney, Agent, or Firm* — Finnegan, Henderson, Farabow, Garrett & Dunner LLP

(57) ABSTRACT

Traditionally, forecasting models were developed using pest or disease instances collected through pest or disease surveillance. The present disclosure relates to pest forecasting using historical pesticide usage information thereby obviating need for voluminous and time consuming effort of collecting site specific data. Firstly forecasting models for different pests or diseases of different crops are generated based on historical data on pesticide usage and historical weather data collected for a geo-location under consideration. The model is validated and adapted with the current scenario of pests. Current scenario is captured using image samples sent from the field or farm through participatory sensing platform. The images are then analyzed to extract information like actual pest infestation in the field, severity, if there was infestation and the like. This analyses helps to derive the actual pest infestation instances in the field.

5 Claims, 5 Drawing Sheets

(51) Int. Cl.
*G06F 30/20* (2020.01)
*G06Q 50/02* (2012.01)
*A01N 25/00* (2006.01)
*G06Q 10/04* (2012.01)
*G06F 17/11* (2006.01)

(52) U.S. Cl.
CPC ............. *G06Q 10/04* (2013.01); *G06Q 50/02* (2013.01); *G06N 20/00* (2019.01)

(56) References Cited

U.S. PATENT DOCUMENTS

| | | | |
|---|---|---|---|
| 2011/0035246 A1 | 2/2011 | Fithian et al. | |
| 2014/0032175 A1 | 1/2014 | Agrawal et al. | |
| 2016/0019560 A1* | 1/2016 | Benkert | G06Q 30/0201 700/284 |
| 2016/0150744 A1* | 6/2016 | Lin | A01M 31/002 43/107 |

OTHER PUBLICATIONS

Arya, Predicting Pest Population Using Weather Variables : An Arimax Time Series Framework (Year: 2015).*

* cited by examiner

SYSTEMS AND METHODS FOR PEST FORECASTING USING HISTORICAL PESTICIDE USAGE INFORMATION

PRIORITY CLAIM

This U.S. patent application claims priority under 35 U.S.C. § 119 to: India Application No. 201621023796 filed on Jul. 12, 2016. The entire contents of the aforementioned application are incorporated herein by reference.

TECHNICAL FIELD

The embodiments herein generally relate to pest management, and more particularly to systems and methods for pest forecasting using historical pesticide usage information.

BACKGROUND

Agriculture plays an important role in sustaining and enhancing human life. Accordingly, a lot of research is prevalent in ecological forecasting in agricultural domain for forecasting of pest, disease infestation instances, pest severity and disease severity. Traditionally, surveillance data collected on pest or disease infestation instances are relied upon for forecasting model generation or training of the models. As such, voluminous data of pest or disease incidences are required to build a reliable model. Collecting these data through surveillance method is tedious, time consuming and costly as it also requires immense manpower to collect the data from fields. Also, researchers need to wait for a long time period to generate a good training dataset for reliable model generation. In case of field or site specific forecasting model generation it becomes very much difficult to collect such huge amount of data from each of the fields.

SUMMARY

Embodiments of the present disclosure present technological improvements as solutions to one or more of the above-mentioned technical problems recognized by the inventors in conventional systems.

Systems and methods of the present disclosure facilitate generating field or site specific pest forecasting models in an efficient and time and cost effective manner.

In an aspect, there is provided a processor implemented method comprising: receiving a first set of inputs pertaining to pesticide application associated with a pest in a geo-location under consideration and agronomic information thereof; estimating, based on the first set of inputs, a time instance ($t_0$) pertaining to an affecting stage where the pest starts affecting vegetation in the geo-location; and estimating a set of time instances ($t_{-1}$) pertaining to an inoculation stage based on the time instance ($t_0$) and a pre-defined range of weather conducive lag ($\tau$) between each time instance ($t_{-1}$) from the set of time instances ($t_{-1}$) and the time instance ($t_0$), the pre-defined range of weather conducive lag ($\tau$) being characterized by life cycle of the pest or disease affecting the vegetation.

In another aspect, there is provided a system comprising: one or more data storage devices operatively coupled to the one or more processors and configured to store instructions configured for execution by the one or more processors to: receive a first set of inputs pertaining to pesticide application associated with a pest in a geo-location under consideration and agronomic information thereof; estimate, based on the first set of inputs, a time instance ($t_0$) pertaining to an affecting stage where the pest starts affecting vegetation in the geo-location; and estimate a set of time instances ($t_{-1}$) pertaining to an inoculation stage based on the time instance ($t_0$) and a pre-defined range of weather conducive lag ($\tau$) between each time instance ($t_{-1}$) from the set of time instances ($t_{-1}$) and the time instance ($t_0$), the pre-defined range of weather conducive lag ($\tau$) being characterized by life cycle of the pest or disease affecting the vegetation.

In yet another aspect, there is provided a computer program product comprising a non-transitory computer readable medium having a computer readable program embodied therein, wherein the computer readable program, when executed on a computing device, causes the computing device to: receive a first set of inputs pertaining to pesticide application associated with a pest in a geo-location under consideration and agronomic information thereof; estimate, based on the first set of inputs, a time instance ($t_0$) pertaining to an affecting stage where the pest starts affecting vegetation in the geo-location; and estimate a set of time instances ($t_{-1}$) pertaining to an inoculation stage based on the time instance ($t_0$) and a pre-defined range of weather conducive lag ($\tau$) between each time instance ($t_{-1}$) from the set of time instances ($t_{-1}$) and the time instance ($t_0$), the pre-defined range of weather conducive lag ($\tau$) being characterized by life cycle of the pest or disease affecting the vegetation.

In an embodiment of the present disclosure, the one or more hardware processors are further configured to receive a second set of inputs pertaining to historical weather data associated with a geo-location under consideration; and generate a pest forecasting model for each pest corresponding to each time instance ($t_{-1}$) from the set of time instances pertaining to the inoculation stage ($t_{-1}$), the pest forecasting model being trained based on at least a portion of data received over a pre-defined time period, pertaining to (i) the time instance ($t_0$) (ii) the time instances ($t_{-1}$) and (iii) the second set of inputs.

In an embodiment of the present disclosure, the one or more hardware processors are further configured to test, for accuracy, the pest forecasting model corresponding to each time instance ($t_{-1}$) based on remaining portion of the data received over the pre-defined time period, pertaining to (i) the time instance ($t_0$) (ii) the time instances ($t_{-1}$), and (iii) the second set of inputs over the pre-defined time period; and generate an optimum pest forecasting model based on an optimum weather conducive lag from the pre-defined range of weather conducive lag ($\tau$), the optimum weather conducive lag generating highest accuracy.

In an embodiment of the present disclosure, the one or more hardware processors are further configured to validate and adapt the optimum pest forecasting model based on reported first set of inputs.

In an embodiment of the present disclosure, the reported first set of inputs comprises one or more of participatory sensing inputs and crowd sourcing inputs pertaining to the agronomic information.

In an embodiment of the present disclosure, the one or more processors are further configured to validate and adapt the optimum pest forecasting model by: receiving images from the reported first set of inputs; filtering the received images to identify pest/disease patches and extract corresponding portion of vegetation as region of interest (ROI) in the images; analyzing one or more features, in the ROI, from the group of features consisting of color, shape and texture; computing maturity of pest based on the analyzed one or more features; and adapting the optimum forecasting model based on the computed maturity of pest.

It is to be understood that both the foregoing general description and the following detailed description are exemplary and explanatory only and are not restrictive of the embodiments of the present disclosure, as claimed.

BRIEF DESCRIPTION OF THE DRAWINGS

The embodiments herein will be better understood from the following detailed description with reference to the drawings, in which.

Figure 1:
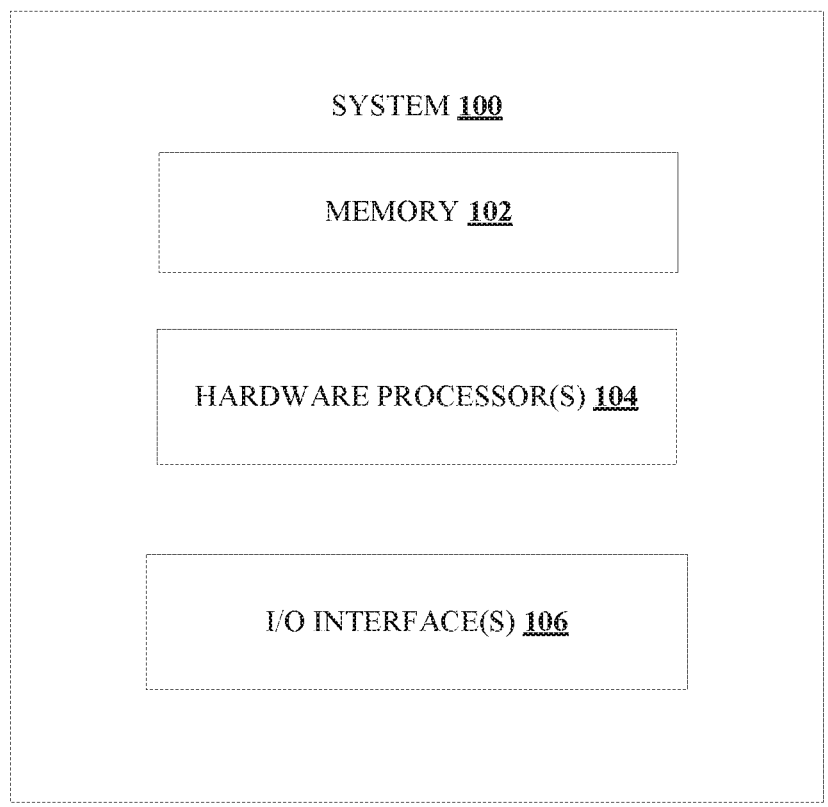
FIG. 1 illustrates an exemplary block diagram of a system for pest forecasting using historical pesticide information, in accordance with an embodiment of the present disclosure.

It should be appreciated by those skilled in the art that any block diagram herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computing device or processor, whether or not such computing device or processor is explicitly shown.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Before setting forth the detailed explanation, it is noted that all of the discussion below, regardless of the particular implementation being described, is exemplary in nature, rather than limiting.

Generation of ecological models like pest or disease forecasting models requires ground truth on actual incidences of pest or diseases in the field. Collection of information on pest or disease incidence instances using surveillance method is very time consuming and costly. Most farmers or agricultural organizations maintain data pertaining to usage of chemicals/pesticides in their farms for cost-benefit analysis which the present disclosure utilizes for development of forecasting models In accordance with the present disclosure, there is no added effort required to be taken by farmers for such data collection and data from large number of farms at a given instance can be collected easily as compared to the traditional approach wherein visits to farms is required for collecting such data.

Thus, the present disclosure addresses the problem of providing field specific pest or disease forecasting models generated based on field specific farming practices. The present disclosure provides systems and methods for generating pest instance forecasting model based on historical information on pesticide usage and field specific farming practices or agronomic information that is easily available as compared to data pertaining to actual pest instances. Historical pesticide data like instance of pesticide application, quantity of the pesticide used, fraction of total section area covered at each instances of pesticide spray, type of spray (like spot spray or blanket spray) applied can give information about the actual pest infestation instances. In an embodiment, pest instance forecasting can lead to disease forecasting. Pest infestation instances can be detected correctly from pesticide data only when the pesticide usage is prophylactic in nature, i.e. pesticide has been applied in the farm only when the pest infestation in the farm has been identified. A typical method of preparing ground truth on pest infestation instances includes normalizing pesticide quantity/area covered within 1-6 days for each instance of pesticide application. Pest infestation instances is set to normalized value of pesticide quantity minus the pesticide application date. Pest infestation is then assumed to be sustained for next 5 days.

Referring now to the drawings, and more particularly to FIGS. 1 through 6, where similar reference characters denote corresponding features consistently throughout the figures, there are shown preferred embodiments and these embodiments are described in the context of the following exemplary system and method.

FIG. 1 illustrates an exemplary block diagram of a system 100 for pest forecasting using historical pesticide information, in accordance with an embodiment of the present disclosure. In an embodiment, the system 100 includes one or more processors 104, communication interface device(s) or input/output (I/O) interface(s) 106, and one or more data storage devices or memory 102 operatively coupled to the one or more processors 104. The one or more processors 104 that are hardware processors can be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in the memory. In an embodiment, the system 100 can be implemented in a variety of computing systems, such as laptop computers, notebooks, hand-held devices, workstations, mainframe computers, servers, a network cloud and the like.

The I/O interface device(s) 106 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the I/O interface device(s) can include one or more ports for connecting a number of devices to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In an embodiment, one or more modules (not shown) of the system 100 can be stored in the memory 102.

Figure 2:
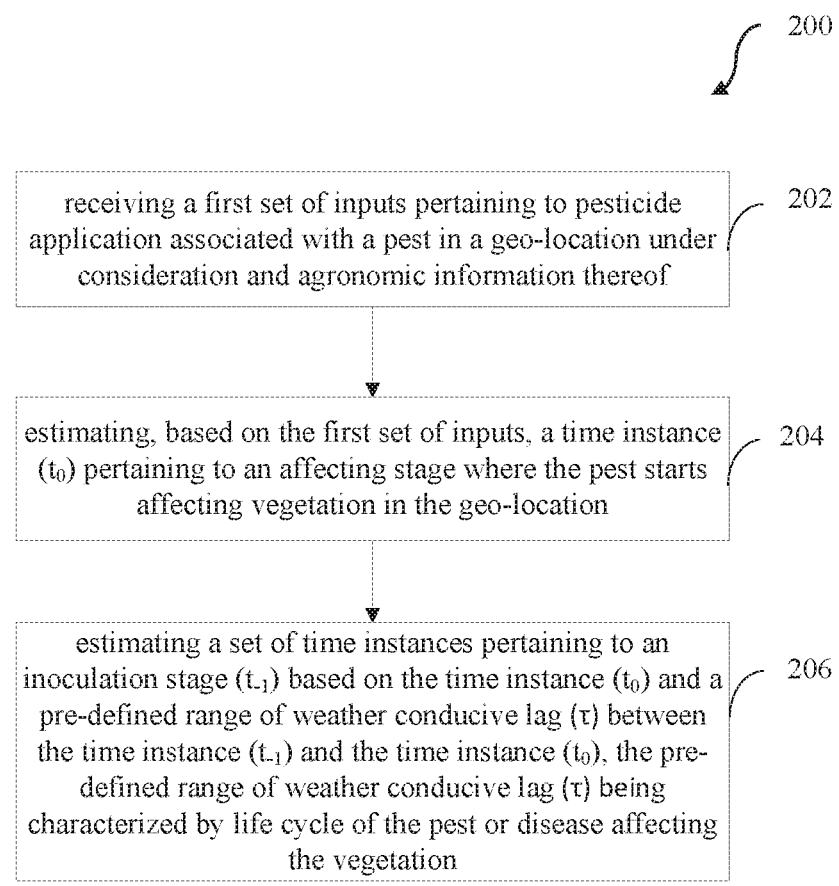
FIG. 2 illustrates an exemplary flow diagram of a method for pest forecasting primarily based on historical pesticide information, in accordance with an embodiment of the present disclosure.

FIG. 2 illustrates an exemplary flow diagram of a method 200 for pest forecasting primarily based on historical pesticide information, in accordance with an embodiment of the present disclosure. In an embodiment, the system 100 comprises one or more data storage devices or memory 102 operatively coupled to the one or more processors 104 and is configured to store instructions configured for execution of steps of the method 200 by the one or more processors 104.

In an embodiment of the present disclosure, at step 202, the one or more processors 104 receive a first set of inputs pertaining to pesticide application associated with a pest in a geo-location under consideration and agronomic information pertaining to that geo-location. In an embodiment, pesticide inputs pertaining to pesticide application may include one or more of date of pesticide application, quantity of pesticide, dosage of pesticide, area covered during each instance of pesticide application, type of pesticide, method of application, and the like. Likewise, in an embodiment, agronomic information may include crop specific information, terrain and vegetation information, and the like that may be received in any form such as text or images. In an embodiment, agronomic information may be contextual data or crop specific data, data pertaining to methods used by farmers to raise crops and care for the soil, farming practices like pesticide application schedules, if pesticide is applied repeatedly or in periodic manner, and the like obtained directly from farmers or via satellites, UAVs, terrestrial sensors, and such other systems that operate on geo-spatial technologies and provide geo-spatial datasets.

Figure 3:
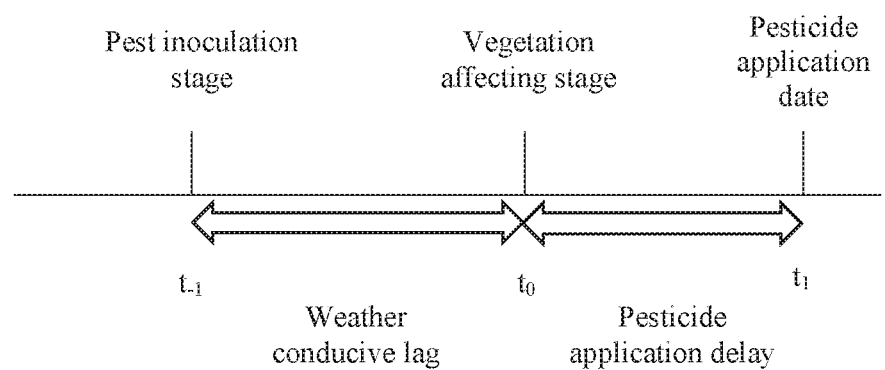
FIG. 3 illustrates an exemplary timeline from pest inoculation stage to pesticide application date, in accordance with an embodiment of the present disclosure.

FIG. 3 illustrates an exemplary timeline from pest inoculation stage to pesticide application date, in accordance with an embodiment of the present disclosure. Pesticide quantity is thus used to decide the pesticide application delay as illustrated in FIG. 3 and described herein above with an exemplary pseudo-code. $t_1$ is the instance of pesticide application in the farm. Pesticide quantity will be high if pesticide application is much delayed from the actual visual appearance of the pest. So, from the information on quantity of pesticide and the time instance $t_1$, a time instance $t_0$ is decided, which is the time instance when pest is in that life cycle stage when it starts affecting the plant. The conducive weather condition helps the pest to grow from its inoculation stage ($t_{-1}$) to the vegetation affecting stage. The weather conducive lag ($t_0$-$t_{-1}$) is varied within a range of values depending on the cycle information of the pest to identify best time period which mostly correlate with pest infestation instances. Accordingly from each instance of pesticide application throughout the year, pest infestation instances can be mapped. Using these pest infestation instances $t_0$ along with weather information for the identified weather conducive lag and other field specific parameters field specific forecasting model can be generated.

In an embodiment of the present disclosure, at step 204, the one or more processors 104 estimate the time instance ($t_0$) pertaining to an affecting stage where the pest starts affecting vegetation in the geo-location based on the received first set of inputs at step 202. In an embodiment, pseudo code for estimating the time instance ($t_0$) may be represented as—

Figure 4:
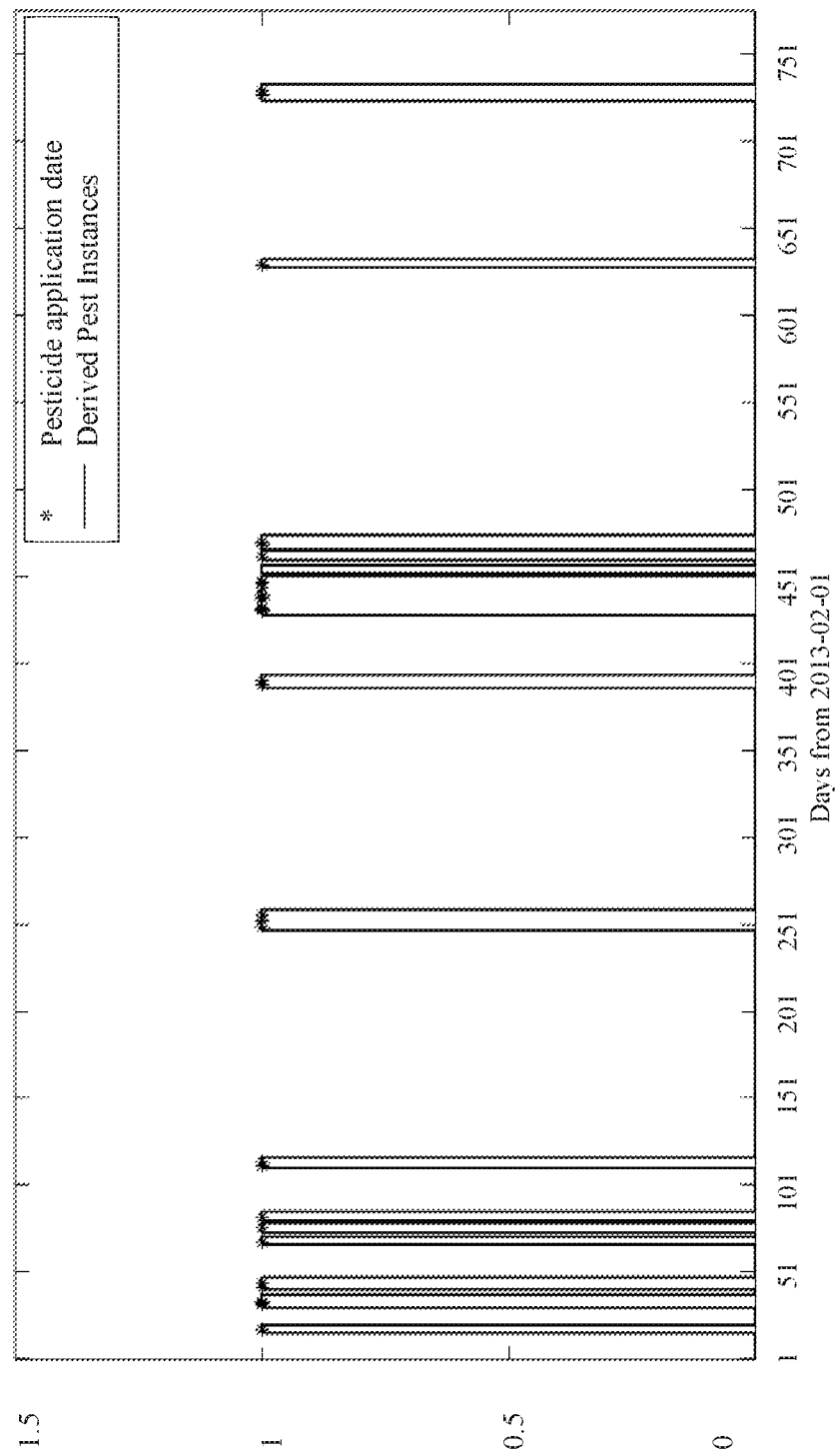
FIG. 4 illustrates a risk graph of pest infestation, wherein pesticide application date and derived pest instances (binary) are plotted versus relevant dates, in accordance with an embodiment of the present disclosure.

Identify pesticide used for a particular disease.
Initialize disease risk for each day in study period to low (0).
Keep flag=0 for each day to keep track whether pesticide application of that day has been already checked or not.
For each date tin study period
  If pesticide has been applied on that day and flag=0 for that day
    i. Calculate total quantity of pesticide/area ($Q_A$) applied on that day and in consecutive days ($t_c$).
    ii. Find pesticide application delay (normalize $Q_A$ within 1-6 range):
    Pesticide Application Delay, $$T_{PA} = 1 + \frac{(Q_A - Q_A\min)*5}{(Q_A\max - Q_A\min)}$$

where, $Q_A\min$ and $Q_A\max$ are minimum and maximum quantity of pesticide used in the geo-location under consideration for that particular pest.
    iii. Assign disease risk high (1) for each day from ($t$–$T_{PA}$) to ($t$+$t_c$+5). [to consider pest sustenance (PS), experimentally set to 5, shown in FIG. 5 referred herein below) in case of no control].
    iv. Make flag=1 for each day from ($t$–$\tau_{PA}$) to ($t$+$t_c$).
Output: Disease risk (0/1) for each day in study period. $t_0$ are the days for which disease risk is 1. FIG. 4 illustrates a risk graph of pest infestation, wherein pesticide application date and derived pest instances (binary) are plotted versus relevant dates, in accordance with an embodiment of the present disclosure. The risk values serve as dependent variables for training the forecasting models.

Variable effects of pesticides on pest prediction over different days lag has to be considered when developing the forecasting model. In an embodiment, system of the present disclosure computes the time period which can create a conducive condition for the pest to grow to that stage when it starts affecting the plant and causes the infestation in consecutive time instances. Weather of past few days from the instance of visual appearance of the pest or the stage of the pest when it starts affecting the plant will have strong correlations or effect on the consecutive pest instances. In this disclosure, this time period is defined as weather conducive lag. This weather conducive lag will vary from pest to pest and disease to disease based on their life cycle. The system 100 of the present disclosure supports identification of the weather conducive lag for different pests or diseases. Based on available information on pest life cycle or disease cycle, the weather conducive lag can be varied to identify the optimum weather conducive lag which will have highest correlation with the consecutive pest infestation instances.

In an embodiment of the present disclosure, at step 206, the one or more processors 104 estimate a set of time instances ($t_{-1}$) pertaining to an inoculation stage based on the time instance ($t_0$) and a pre-defined range of weather conducive lag ($\tau$) between each time instance ($t_{-1}$) from the set of time instances ($t_{-1}$) and the time instance ($t_0$) (206). In an embodiment, the pre-defined range of weather conducive lag ($\tau$) is characterized by life cycle of the pest or disease affecting the vegetation.

In an embodiment, pseudo code for estimating the time instance ($t_{-1}$) may be represented as—

Define weather conducive lag ($\tau$), as $\tau=(t_0-t_{-1})$.

Identify the range to vary $\tau$, based on information gathered from literature regarding the life cycle of the pest or disease.

For each lag, $\tau=6$ to 30 (as per literature time span required by the pest to grow to larva or adult stage, value range indicated being specific to a pest 'tea looper')

Generate training set.
    For each day t within study period
      i. Extract weather information for (t−$\tau$) days.
      ii. Calculate statistical features like mean, standard deviation, skewness, kurtosis, coefficient of variation from weather of (t−$\tau$) days and set as feature vector or independent variables of each training sample for each day.

Train a forecasting model such as Random Forest Model (from literature) using 80% of the samples.

Test developed forecasting model on rest 20% samples and find test set accuracy.

Assign weather conducive lag as $\tau$, for which test set accuracy is highest.

Final or optimum forecasting model is defined as the model which gives best test set accuracy.

Thus, in an embodiment, the one or more processors 104 generate an optimum pest forecasting model based on an optimum weather conducive lag from the pre-defined range of weather conducive lag ($\tau$), wherein the optimum weather conducive lag generates highest accuracy.

Figure 5:
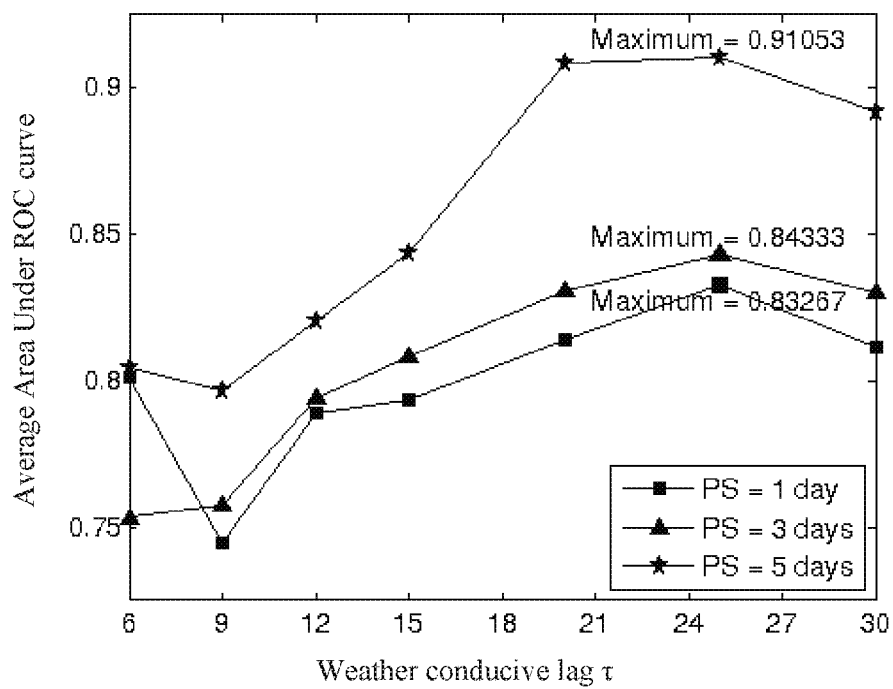
FIG. 5 illustrates an exemplary graph of average area under receiver operating characteristic (ROC) curve versus weather conducive lag ($\tau$), in accordance with an embodiment of the present disclosure.

Output: This technique returns a value of weather conducive lag $\tau$. $t_{-1}$ is defined as, $t_0-\tau$. FIG. 5 illustrates an exemplary graph of average area under receiver operating characteristic (ROC) curve versus weather conducive lag, in accordance with an embodiment of the present disclosure. If the average area under ROC curve tends to 1, the accuracy is higher.

Weather information aids in identifying past pest infestation instances because pesticide usage is also dependent on some weather factors like rainfall. If after a pesticide spray there is a heavy rainfall then pesticide application is repeated in that case. So, to decide pest infestation instances from pesticide usage, these factors need to be considered. In an embodiment, the method 200 further provides receiving a second set of inputs pertaining to historical weather data associated with a geo-location under consideration. In an embodiment, the weather inputs may be received via Wireless Sensor Networks (WSN), Automatic Weather Stations (AWS), weather satellites, and the like. In an embodiment, the weather inputs may comprise data pertaining to temperature, rainfall, humidity, and such other weather parameters that are critical to crop management and pest control. In an embodiment, the second set of inputs may be statistical variability of weather parameters of past few days (varied within a range of 6-30) from each day in the study period.

In an embodiment, the one or more processors 104 generate a pest forecasting model for each pest corresponding to each time ($t_{-1}$) from the set of time instances pertaining to the inoculation stage ($t_{-1}$). The pest forecasting model is trained based on at least a portion of data received over a pre-defined time period, pertaining to (i) the time instance ($t_0$) (ii) the time instances ($t_{-1}$) and (iii) the second set of inputs. In an embodiment, the at least a portion of data may be 80% of the received data. The one or more processors 104 further test the pest forecasting model corresponding to each time instance ($t_{-1}$) for accuracy based on remaining portion of the data received over the pre-defined time period. In an embodiment, the remaining portion of the data may be 20% of the received data.

The structure of the optimum pest forecasting model structure and its parameters for each field may get modified based on error between actual observation and the predicted outcome. The system 100 of the present disclosure adapts the generated pest forecasting model with current scenario of pests and improves the model with time. In one embodiment, the current scenario of pest infestation are based on on-field observation captured using samples collected from farms through participatory sensing platform. If the pest forecasting model outcome does not match with the actual pest infestation in farms, then the error is adapted in the model. The on-field observations may include sensor data from wireless sensor networks and events captured by mobile phone applications (including farm operations, pesticide spray activities or any other information that can uniquely identify a field). Wireless Sensor Networks (WSNs) have a base station and different sensor nodes with sensors capturing hourly temperature, humidity, soil moisture, leaf wetness, light intensity, etc. Sensed parameters from different sensor nodes can be aggregated for the geo-location under consideration. Thus, in an embodiment, the one or more processors 104 further validate and adapt the optimum pest forecasting model based on reported first set of inputs. For instance, the reported first set of inputs may comprise one or more of participatory sensing inputs and crowd sourcing inputs pertaining to the agronomic information.

In an embodiment, the one or more processors 104 may validate and adapt the optimum pest forecasting model by first receiving images from the reported first set of inputs. The received images are filtered to extract region of interest (ROI) in the images. In an embodiment, the ROI may be a portion of vegetation like leaves or stem that has pest/disease patches therein in the images, the disease patches being pest infected patches. The ROI may be then analyzed for one or more features such as size, color, shape, texture, and the like. Based on the analyzed features, maturity of pest/disease may be computed and the optimum forecasting model can be adapted accordingly. In an exemplary embodiment, the reported first set of inputs may include images of infected leaves/stem and time stamp of image capture from fields through a Rural Participatory Sensing Application. Rural participatory sensing makes large scale validation and adaption of developed forecasting model. The received images may be filtered, pest/disease patches on the infected leaves/stem may be identified and image analysis may be performed to compute maturity of pest at the time of image capture. From the information pertaining to maturity of pest/disease, actual pest infestation instances may be derived. For instance, if pest is of age 10 days, actual pest infestation instance is taken as 10 days back from the date of event reporting.

In an embodiment, pseudo code for image analysis may be represented as—

Remove background and Extract leaves from images captured under uncontrolled environment.
  Separate pest / disease patches (ROIs) from the leaves.
  If there is any ROI with pest / disease patch
    Analyze color, shape, texture of the extracted ROIs to identify which pest / disease.
  If pest / disease identified by farmer is correct (based on image analysis)

```
    Identify the maturity of the pest / disease, d_M (analyzing
    severity of the disease or life cycle of the pest) through image
    processing using color, texture or shape of pest / disease
    patch.
    Return d_M.
  Else
    Show message ("Reported pest / disease is not same as for
    forecasted")
  Else
    Show message ("No pest / disease Infestation")
```

Figure 6:
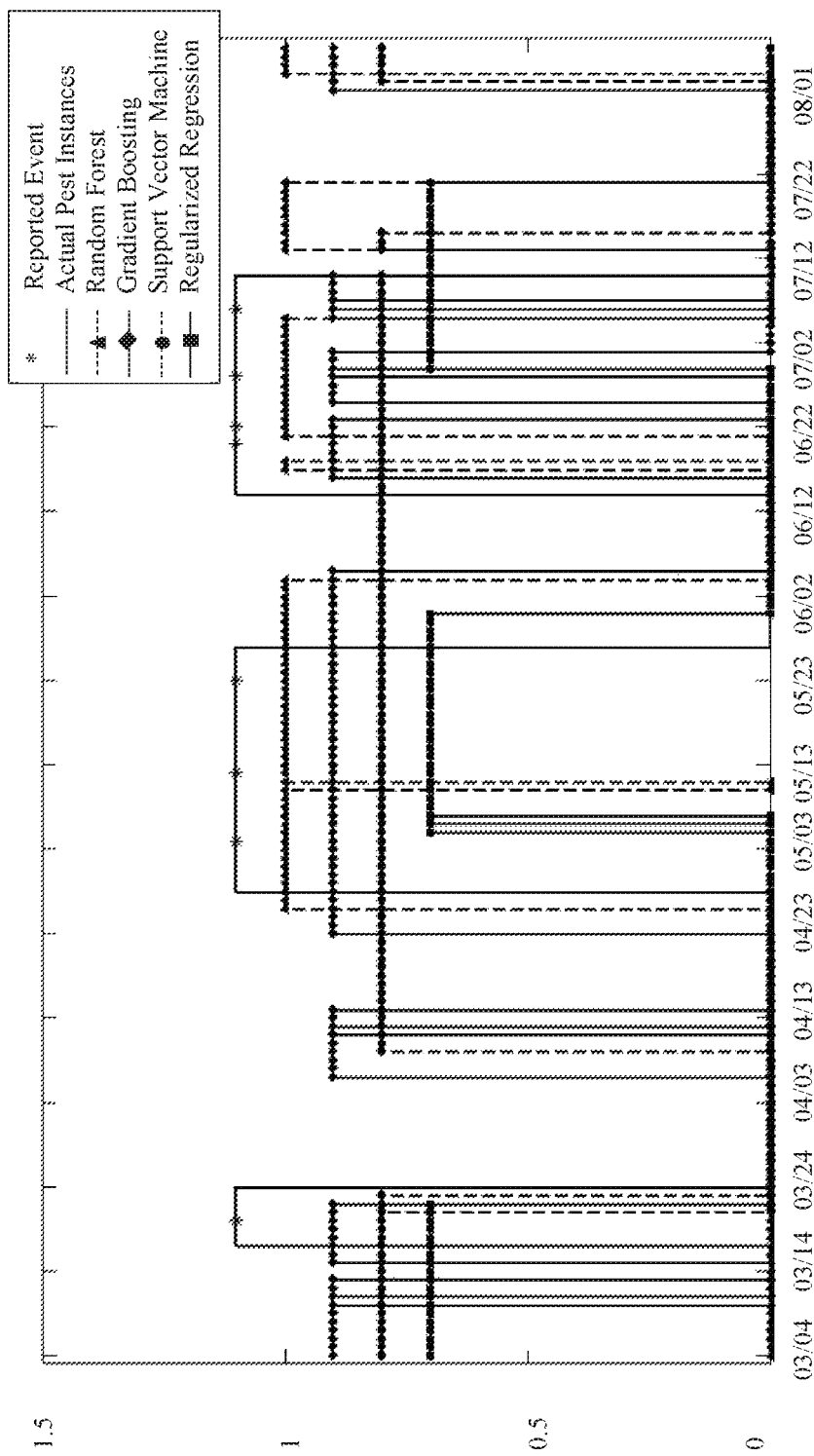
FIG. 6 illustrates a graphical illustration of actual pest instances, reported events and predicted pest instances by different models (Random forest, gradient boosting, regression tree and Support Vector Machine (SVM)), in a validation phase, in accordance with an embodiment of the present disclosure.

FIG. 6 illustrates a graphical illustration of actual pest instances, reported events and predicted pest instances by different models (Random forest, gradient boosting, regression tree and Support Vector Machine (SVM)), in a validation phase, in accordance with an embodiment of the present disclosure. The illustrated comparison of predicted high risk dates and actual pest instances derived from reported events may be used for adaptation of the developed forecasting models.

In an embodiment, pseudo code for validating and adapting the optimum pest forecasting model may be represented as—

```
For each day check
    If farmer has reported images (note: actually pest / disease
present in field/farm)
        If pest / disease risk is high according to pest / disease
forecasting
            Pest / Disease_Maturity, d_M = Image_Analysis (Reported
    Image)
            Adapt_Forecasting (d_M, t_R), where t_R= date of reporting.
            [note: to adapt mismatch of days (if any) for high pest /
            disease risk from forecasting and event reporting]
        Else
            Pest / Disease Maturity, d_M = Image_Analysis (Reported
    Image)
            Adapt_Forecasting (d_M, t_R). [note: as forecasting is not
            showing high pest / disease risk]
    Else (note: presence of pest / disease in field/farm has not been
reported)
        If pest / disease risk high according to pest / disease forecasting
            Ask farmers to report image using participatory sensing
            application.
            Pest / Disease_Maturity, d_M = Image Analysis (Reported
    Image)
                If Pest / Disease Present in farm
                    Adapt_Forecasting (d_M, t_R), where t_R= date of
                    reporting. [note: to adapt mismatch of days (if any) for
                    high pest / disease risk from forecasting and event
                    reporting]
                Else
                    Adopt error of forecasting. [note: as forecasting shows
                    high pest / disease risk, but there is no pest / disease
                    in field/farm]
        Else
            If time gap from last reported image for that disease has
            exceeded a specified time interval [note: to avoid situations
            when forecasting does not show high pest / disease risk,
            farmers also haven't reported images, but actually there is
            pest / disease infestation in field/farm]
                Ask farmers to report image using participatory
                sensing application.
                Pest / Disease_Maturity, d_M = Image_Analysis
                (Reported Image)
                    If Pest / Disease Present in farm
                        Adopt error of forecasting. [note: as
                        forecasting is not showing high pest /
                        disease risk]
                    Else
                        Continue.
```

In an embodiment, the reported first set of inputs may be stored in a database for further processing. The database may also contain events reported from participatory sensing platforms. Farmers may use a mobile phone application for capturing on-field events. Exemplary event attributes that may be captured include geo-tagged images of pest or disease affected vegetation, pest counts on each plant or leaf, number of plants damaged in farms, number of leaves damaged, severity of pest or disease, percentage of leaf area damaged, and the like. Using this information, the system of the present disclosure can suitably update the pest forecasting model.

Following are the cases when the performance of the system of the present disclosure may get affected:

When disease/pest risk is high for a region but due to lack of participation no events are reported. To handle lack of participation, in an embodiment, the system of the present disclosure may assign tasks to farmers for a specific region or field to report events when the forecasting model shows continuously high disease/pest risk in that region when no event has been reported from that location within a specific time window. Alternatively, the system of the present disclosure may trigger the application on farmer's mobile phone to request them to observe their farms and report events when the forecasting model shows high risk.

When actually disease/pest risk is high for a region, but forecasting model shows low disease risk and no event is reported. This situation is handled by the system of the present disclosure by periodically sending a request for event reporting irrespective of the forecast on disease risk.

When disease or pest infestation in field are reported with a delay. In an embodiment, the system of the present disclosure can handle delayed reporting of events. For instance, when the forecasting model shows a low disease risk and also no events have been reported from that location, but actually pest or disease incidence happened there would be handled by asking event reporting at periodic time interval. The system can predict actual date of pest or disease incidence by analyzing the severity of the disease or pest calculated from the images received from delayed events.

In an embodiment, the system of the present disclosure may propose incentive mechanisms for its users. Incentives may be decided based on the performance of users with regards to timely response to disease/pest infestation, response to requests for periodic sharing of information, and the like.

In an embodiment, the system and method of the present disclosure provides a digitized farm diary which may keep record of all farming activities for future references for a specific scenario. Pest or disease incidences and corresponding chemical usages in each farm or site can be tracked and recorded. This will help farmers to decide on the control measures to be taken in future. Likewise, different farming activities like irrigation, fertilizer application, control measures taken for a particular pest of disease infestation scenario can also be tracked which will help farmers to generate similar yield or improve the yield in future instances.

The written description describes the subject matter herein to enable any person skilled in the art to make and use the embodiments of the present disclosure. The scope of the subject matter embodiments defined here may include other modifications that occur to those skilled in the art. Such other modifications are intended to be within the scope if they have similar elements that do not differ from the literal language of the claims or if they include equivalent elements with insubstantial differences from the literal language.

It is, however to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments of the present disclosure may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various modules comprising the system of the present disclosure and described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device. The various modules described herein may be implemented as software and/or hardware modules and may be stored in any type of non-transitory computer readable medium or other storage device. Some non-limiting examples of non-transitory computer-readable media include CDs, DVDs, BLU-RAY, flash memory, and hard disk drives.

Further, although process steps, method steps, techniques or the like may be described in a sequential order, such processes, methods and techniques may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It is intended that the disclosure and examples be considered as exemplary only, with a true scope and spirit of disclosed embodiments being indicated by the following claims.

What is claimed is:

1. A processor implemented method (200) comprising:
receiving a first set of inputs pertaining to pesticide application associated with a pest in a geo-location under consideration and agronomic information thereof (202), wherein the first set of inputs pertaining to the pesticide application include one or more of date of the pesticide application, quantity of the pesticide, dosage of the pesticide, area covered during each instance of the pesticide application, type of the pesticide and method of application;
estimating, based on the first set of inputs, a time instance ($t_o$) pertaining to an affecting stage where the pest starts affecting vegetation in the geo-location (204);
estimating a set of time instances ($t_{-1}$) pertaining to an inoculation stage based on the time instance ($t_o$) and a pre-defined range of weather conducive lag ($\tau$) between each time instance ($t_{-1}$) from the set of time instances ($t_{-1}$) and the time instance ($t_o$) (206), the pre-defined range of weather conducive lag ($\tau$) being characterized by life cycle of the pest or disease affecting the vegetation;
receiving a second set of inputs pertaining to historical weather data associated with the geo-location under consideration;
generating a pest forecasting model for each pest corresponding to each time instance ($t_{-1}$) from the set of time instances pertaining to the inoculation stage ($t_{-1}$), wherein the pest forecasting model is trained based on at least a portion of data received over a pre-defined time period, pertaining to (i) the time instance ($t_o$), (ii) the set of time instances ($t_{-1}$), and (iii) the second set of inputs;
testing accuracy of the pest forecasting model corresponding to each time instance ($t_{-1}$) based on remaining portion of the data received over the pre-defined time period, pertaining to (i) the time instance ($t_o$), (ii) the set of time instances ($t_{-1}$), and (iii) the second set of inputs;
generating an optimum pest forecasting model based on an optimum weather conducive lag from the pre-defined range of weather conducive lag ($\tau$), wherein the optimum weather conducive lag and the set of time instances ($t_{-1}$) are determined by:
extracting historical weather data for ($t-\tau$) days for each day t;
calculating statistical features comprising mean, standard deviation, skewness, kurtosis, coefficient of variation from the historical weather data of ($t-\tau$) days and setting the statistical features as feature vectors of each training sample for each day t;
training the optimum pest forecasting model using at least a portion of the training samples;
testing the optimum pest forecasting model for accuracy based on remaining portion of the training samples;

assigning a weather conducive lag generating highest accuracy from the pre-defined range of weather conducive lag ($\tau$) as the optimum weather conducive lag; and estimating each time instance ($t_{-1}$) pertaining to the inoculation stage based on the time instance ($t_o$) and the optimum weather conducive lag ($\tau$), wherein each time instance ($t_{-1}$) is determined by $t_{o-\tau}$; and validating and adapting the optimum pest forecasting model based on reported first set of inputs, by:
receiving images from the reported first set of inputs;
filtering the received images to identify pest/disease patches and extract corresponding portion of vegetation as region of interest (ROI) in the images;
analyzing one or more features, in the ROI, from the group of features consisting of color, shape and texture;
computing maturity of the pest based on the analyzed one or more features; and
adapting the optimum pest forecasting model based on the computed maturity of the pest.

2. The processor implemented method of claim 1, wherein the reported first set of inputs comprises one or more of participatory sensing inputs and crowd sourcing inputs pertaining to the agronomic information.

3. A system (100) comprising: one or more data storage devices (102) operatively coupled to one or more hardware processors (104) and configured to store instructions configured for execution by the one or more hardware processors to:
receive a first set of inputs pertaining to pesticide application associated with a pest in a geo-location under consideration and agronomic information thereof, wherein the first set of inputs pertaining to the pesticide application include one or more of date of the pesticide application, quantity of the pesticide, dosage of the pesticide, area covered during each instance of the pesticide application, type of the pesticide and method of application;
estimate, based on the first set of inputs, a time instance ($t_o$) pertaining to an affecting stage where the pest starts affecting vegetation in the geo-location;
estimate a set of time instances ($t_{-1}$) pertaining to an inoculation stage based on the time instance ($t_o$) and a pre-defined range of weather conducive lag ($\tau$) between each time instance ($t_{-1}$) from the set of time instances ($t_{-1}$) and the time instance ($t_o$), the pre-defined range of weather conducive lag ($\tau$) being characterized by life cycle of the pest or disease affecting the vegetation;
receive a second set of inputs pertaining to historical weather data associated with the geo-location under consideration;
generate a pest forecasting model for each pest corresponding to each time instance ($t_{-1}$) from the set of time instances pertaining to the inoculation stage ($t_{-1}$), wherein the pest forecasting model is trained based on at least a portion of data received over a pre-defined time period, pertaining to (i) the time instance ($t_o$), (ii) the set of time instances ($t_{-1}$), and (iii) the second set of inputs;
test accuracy of the pest forecasting model corresponding to each time instance ($t_{-1}$) based on remaining portion of the data received over the pre-defined time period, pertaining to (i) the time instance ($t_o$), (ii) the set of time instances ($t_{-1}$), and (iii) the second set of inputs;
generate an optimum pest forecasting model based on an optimum weather conducive lag from the pre-defined range of weather conducive lag ($\tau$), wherein the optimum weather conducive lag generates highest test accuracy for the pest forecasting model, wherein the optimum weather conducive lag and the set of time instances ($t_{-1}$) are determined by:
extracting historical weather data for ($t-\tau$) days for each day t;
calculating statistical features comprising mean, standard deviation, skewness, kurtosis, coefficient of variation from the historical weather data of ($t-\tau$) days and setting the statistical features as feature vectors of each training sample for each day t;
training the optimum pest forecasting model using at least a portion of the training samples;
testing the optimum pest forecasting model for accuracy based on remaining portion of the training samples;
assigning a weather conducive lag generating highest accuracy from the pre-defined range of weather conducive lag ($\tau$) as the optimum weather conducive lag; and
estimating each time instance ($t_{-1}$) pertaining to the inoculation stage based on the time instance ($t_o$) and the optimum weather conducive lag ($\tau$), wherein each time instance ($t_{-1}$) is determined by $t_{o-\tau}$; and
validate and adapt the optimum pest forecasting model based on reported first set of inputs, by:
receiving images from the reported first set of inputs;
filtering the received images to identify pest/disease patches and extract corresponding portion of vegetation as region of interest (ROI) in the images;
analyzing one or more features, in the ROI, from the group of features consisting of color, shape and texture;
computing maturity of the pest based on the analyzed one or more features;
adapting the optimum forecasting model based on the computed maturity of the pest.

4. The system of claim 3, wherein the reported first set of inputs comprises one or more of participatory sensing inputs and crowd sourcing inputs pertaining to the agronomic information.

5. A computer program product comprising a non-transitory computer readable medium having a computer readable program embodied therein, wherein the computer readable program, when executed on a computing device, causes the computing device to:
receive a first set of inputs pertaining to pesticide application associated with a pest in a geo-location under consideration and agronomic information thereof, wherein the first set of inputs pertaining to the pesticide application include one or more of date of the pesticide application, quantity of the pesticide, dosage of the pesticide, area covered during each instance of the pesticide application, type of the pesticide and method of application;
estimate, based on the first set of inputs, a time instance ($t_o$) pertaining to an affecting stage where the pest starts affecting vegetation in the geo-location;
estimate a set of time instances ($t_{-1}$) pertaining to an inoculation stage based on the time instance ($t_o$) and a pre-defined range of weather conducive lag ($\tau$) between each time instance ($t_{-1}$) from the set of time instances ($t_{-1}$) and the time instance ($t_o$), the pre-defined range of weather conducive lag ($\tau$) being characterized by life cycle of the pest or disease affecting the vegetation;

receive a second set of inputs pertaining to historical weather data associated with the geo-location under consideration;

generate a pest forecasting model for each pest corresponding to each time instance ($t_{-1}$) from the set of time instances pertaining to the inoculation stage ($t_{-1}$), wherein the pest forecasting model is trained based on at least a portion of data received over a pre-defined time period, pertaining to (i) the time instance ($t_o$), (ii) the set of time instances ($t_{-1}$), and (iii) the second set of inputs;

test accuracy of the pest forecasting model corresponding to each time instance ($t_{-1}$) based on remaining portion of the data received over the pre-defined time period, pertaining to (i) the time instance ($t_o$), (ii) the set of time instances ($t_{-1}$), and (iii) the second set of inputs;

generate an optimum pest forecasting model based on an optimum weather conducive lag from the pre-defined range of weather conducive lag ($\tau$), wherein the optimum weather conducive lag generates highest test accuracy for the pest forecasting model, wherein the optimum weather conducive lag and the set of time instances ($t_{-1}$) are determined by:

extracting historical weather data for ($t-\tau$) days for each day t;

calculating statistical features comprising mean, standard deviation, skewness, kurtosis, coefficient of variation from the historical weather data of ($t-\tau$) days and setting the statistical features as feature vectors of each training sample for each day t;

training the optimum pest forecasting model using at least a portion of the training samples;

testing the optimum pest forecasting model for accuracy based on remaining portion of the training samples;

assigning a weather conducive lag generating highest accuracy from the pre-defined range of weather conducive lag ($\tau$) as the optimum weather conducive lag; and estimating each time instance ($t_{-1}$) pertaining to the inoculation stage based on the time instance ($t_o$) and the optimum weather conducive lag ($\tau$), wherein each time instance ($t_{-1}$) is determined by $t_{o-\tau}$; and validate and adapt the optimum pest forecasting model based on reported first set of inputs, receiving images from the reported first set of inputs;

filtering the received images to identify pest/disease patches and extract corresponding portion of vegetation as region of interest (ROI) in the images;

analyzing one or more features, in the ROI, from the group of features consisting of color, shape and texture;

computing maturity of the pest based on the analyzed one or more features; and adapting the optimum forecasting model based on the computed maturity of the pest.

\* \* \* \* \*